(12) United States Patent
Pourquier et al.

(10) Patent No.: US 12,721,221 B2
(45) Date of Patent: Aug. 25, 2026

(54) OPTOELECTRONIC DEVICE AND METHOD FOR MANUFACTURING SUCH A DEVICE

(71) Applicant: ALEDIA, Échirolles (FR)

(72) Inventors: Eric Pourquier, Grenoble (FR); Timothée Lassiaz, Grenoble (FR)

(73) Assignee: ALEDIA, Échirolles (FR)

( * ) Notice: Subject to any disclaimer, the term of this patent is extended or adjusted under 35 U.S.C. 154(b) by 455 days.

(21) Appl. No.: 18/212,830

(22) Filed: Jun. 22, 2023

(65) Prior Publication Data

US 2024/0006398 A1 Jan. 4, 2024

(51) Int. Cl.

| | |
|---|---|
| ***H10W 90/00*** | (2026.01) |
| ***H10H 20/01*** | (2025.01) |
| ***H10H 20/81*** | (2025.01) |
| ***H10H 20/822*** | (2025.01) |
| ***H10H 20/85*** | (2025.01) |

(52) U.S. Cl.

CPC ............ *H10W 90/00* (2026.01); *H10H 20/01* (2025.01); *H10H 20/81* (2025.01); *H10H 20/822* (2025.01); *H10H 20/8506* (2025.01); *H10H 20/036* (2025.01)

(58) Field of Classification Search

CPC .. H10H 20/818; H10H 20/819; H10H 20/821; H10H 20/8162; H10H 20/816; H10H 20/0133; H10H 20/01335; H10H 20/813; H10H 20/8215; H10H 29/14; H10H 20/01–0365

USPC ............................................................ 257/79

See application file for complete search history.

(56) References Cited

U.S. PATENT DOCUMENTS

| | | | | |
|---|---|---|---|---|
| 8,664,027 | B2 | 3/2014 | Yu et al. | |
| 9,444,007 | B2 | 9/2016 | Kryliouk et al. | |
| 9,799,796 | B2 | 10/2017 | Herner et al. | |
| 10,698,158 | B1 | 6/2020 | Bonar et al. | |
| 2004/0048409 | A1* | 3/2004 | Biwa | H01S 5/10 438/22 |
| 2004/0092055 | A1* | 5/2004 | Liu | H10H 20/8506 257/E31.117 |
| 2005/0194584 | A1 | 9/2005 | Slater, Jr. et al. | |
| 2011/0244616 | A1 | 10/2011 | Yu et al. | |
| 2014/0077220 | A1* | 3/2014 | Kryliouk | H10H 20/821 438/29 |
| 2022/0140183 | A1* | 5/2022 | Han | H10H 20/8162 257/79 |
| 2023/0049007 | A1* | 2/2023 | Ahmed | H10H 20/01 |

FOREIGN PATENT DOCUMENTS

| | | | | |
|---|---|---|---|---|
| CN | 115020563 | A * | 9/2022 | B82Y 40/00 |
| FR | 3031242 | A1 | 7/2016 | |
| FR | 3098013 | A1 | 1/2021 | |
| WO | 0054342 | A1 | 9/2000 | |
| WO | WO-2015097260 | A1 * | 7/2015 | H10H 20/8162 |
| WO | 2017184686 | A1 | 10/2017 | |

* cited by examiner

*Primary Examiner* — Moazzam Hossain

(74) *Attorney, Agent, or Firm* — CANTOR COLBURN LLP

(57) ABSTRACT

A light-emitting diode for an optoelectronic device or for an optoelectronic member, the light-emitting diode including a semiconductor core, a semiconductor shell, an implanted portion delimiting within the semiconductor shell at least one passivated portion and at least one active portion, the at least one passivated portion having a conductivity strictly lower than a conductivity of said at least one active portion.

10 Claims, 4 Drawing Sheets

(A)

[E3]

(B)

(E4)

OPTOELECTRONIC DEVICE AND METHOD FOR MANUFACTURING SUCH A DEVICE

CROSS REFERENCE TO RELATED APPLICATION

This application is related to and claims the benefit of French Patent Application Number 22/06638 filed on Jun. 30, 2022, the contents of which are herein incorporated by reference in their entirety.

TECHNICAL FIELD

The present disclosure relates to a light-emitting diode, as well as an optoelectronic device comprising such a light-emitting diode.

The disclosure also relates to a method for manufacturing an optoelectronic device.

BACKGROUND

An optoelectronic device is a device configured to perform a conversion of an electric signal into an electromagnetic radiation, like for example a light radiation.

Optoelectronic devices comprising light-emitting diodes, also known under the acronym LED standing for "light-emitting diode", formed over a substrate are known from the prior art.

In general, each light-emitting diode comprises an active material exploiting, or not, quantum wells, a semiconductor portion doped according to a first doping type, for example P doped and a semiconductor portion doped according to a second doping type, for example N doped.

Each light-emitting diode may be formed based on micrometric and possibly nanometric semiconductor three-dimensional elements, themselves obtained at least partially by epitaxial growth such as by metal organic chemical vapour deposition (MOCVD) or by molecular beam epitaxy (MBE) or by hydride vapour phase epitaxy (HVPE). Light-emitting diodes are typically formed based on a semiconductor material comprising for example elements from the III column and from the V column of Mendeleev's periodic table of elements, such as a III-V compound, in particular gallium nitride (GaN), indium and gallium nitride (InGaN) or aluminium and gallium nitride (AlGaN).

There are optoelectronic devices including an array of light-emitting diodes having a given emission surface throughout which the light radiation emitted by the light-radiation diodes is transmitted. In particular, such optoelectronic devices may be used in making display screens or image projection systems, where the array of light-emitting diodes actually defines an array of luminous pixels where each pixel conventionally includes at least one sub-pixel to generate each colour, each sub-pixel containing, in turn, at least one light-emitting diode.

One of the difficulties related to the increase of the definition of screens is how to ensure that the light radiation emitted by the three-dimensional light-emitting diodes of one sub-pixel does not mix up with the light radiation emitted by the light-emitting diodes of an adjacent sub-pixel in order to improve contrasts. Yet, this problem turns out to be more difficult to solve given the increasing miniaturisation of light-emitting diodes.

Moreover, when the definition of the screens increases, the dimensions between the light-emitting diodes and the dimensions of each sub-pixel become micrometric, and even nanometric. The use of three-dimensional light-emitting diodes then becomes inevitable with dimensions of three-dimensional light-emitting diodes smaller and smaller. Yet, the light intensity emitted by the nanometric three-dimensional light-emitting diodes considerably decreases as the size of the three-dimensional light-emitting diodes is reduced.

In particular, this difficulty may be caused by the presence of crystalline defects upon manufacture of the light-emitting diode. It is actually frequent to notice these crystalline defects at the base of the light-emitting diode in particular for light-emitting diodes having a wire-like or pyramidal shape. These crystalline defects may generate dislocations in the crystalline structure which ultimately lead to the degradation of existing quantum wells. This result in undesirable non-radiative recombinations, thereby resulting in a drop in the light efficiency and in the overall efficiency. Indeed, it has been noticed that the presence of degradations at the level of the base of a light-emitting diode having a wire-like or pyramidal shape affected the internal quantum efficiency (IQE) of this light-emitting diode.

BRIEF SUMMARY

The present disclosure aims at providing a solution that addresses all or part of the aforementioned problems. In particular, the present disclosure aims at improving the injection efficiency, and the internal quantum efficiency of light-emitting diodes.

This aim may be achieved thanks to a light-emitting diode for an optoelectronic device, the light-emitting diode having a three-dimensional shape and comprising a height extending according to a first direction between a proximal portion and a distal portion opposite to said proximal portion along said first direction, said light-emitting diode comprising:

- a semiconductor core doped according to a first conductivity type, the proximal portion corresponding to a growth base of said semiconductor core,
- a semiconductor shell doped according to a second conductivity type opposite to the first conductivity type, said semiconductor shell covering at least partially said semiconductor core;

the light-emitting diode comprising an implanted portion extending over an implanted height counted along the first direction, said implanted height being strictly smaller than the height of the diode, said implanted portion being disposed between the distal portion and the proximal portion and being separate from the distal portion, so that the implanted portion delimits within the semiconductor shell at least one passivated portion separate from the distal portion of the light-emitting diode, the semiconductor shell comprising at least one active portion delimited at least partially by said at least one passivated portion, said at least one passivated portion having a conductivity strictly lower than a conductivity of said at least one active portion.

The previously-described arrangements allow providing a light-emitting diode comprising an implanted portion having a locally reduced conductivity. The three-dimensional shape of the light-emitting diode also allows defining more simply an implanted portion in which the conductivity is reduced.

The light-emitting diode may also have one or more of the following features, considered separately or in combination.

In general, the proximal portion corresponds to the portion of the light-emitting diode directed towards the growth substrate from which the portions of the light-emitting diode have grown. For example, the proximal portion may correspond to the growth base of the semiconductor core. This proximal portion typically includes a higher crystalline defect proportion than the distal portion.

In general, the semiconductor shell comprises the distal portion.

More specifically, the distal portion may correspond to one end of the semiconductor shell disposed on a side opposite to that of the semiconductor shell that is directed towards the semiconductor core.

According to one embodiment, the distal portion is the end of the semiconductor shell opposite the proximal portion of the semiconductor core.

According to one embodiment, the distal portion is the portion furthest possible from the growth base of said semiconductor core.

According to one embodiment, the semiconductor shell covers the semiconductor core on the distal portion side, and does not cover the semiconductor core on the proximal portion side.

According to one embodiment, the implanted portion delimits within the semiconductor core at least one first implanted portion separate from the distal portion of the light-emitting diode, the semiconductor core comprising at least one first non-implanted portion delimited at least partially by said at least one first implanted portion, said at least one first implanted portion having an ion concentration strictly different from an ion concentration of said at least one first non-implanted portion.

According to one embodiment, the implanted height of the implanted portion, counted along the first direction, is smaller than 500 nm.

According to one embodiment, the semiconductor core comprises N-doped gallium nitride.

According to one embodiment, the semiconductor shell comprises P-doped gallium nitride.

By "P doping" or "P doped", it should be understood that a semiconductor material comprises a large amount of electron-acceptor atoms allowing obtaining a lower density of free electrons, and therefore an excess of holes, said holes being positively charged.

By "N doping" or "N doped", it should be understood that a semiconductor material comprises a large amount of electron-donor atoms in order to obtain a higher density of free electrons, which are negatively charged.

For example, an electron-donor atom may be: silicon or germanium.

For example, an electron-acceptor atom may be: magnesium.

According to one embodiment, the implanted portion corresponds to a volume of the light-emitting diode delimited by two distinct planes, parallel to each other, for example with respect to a support face of the optoelectronic device. According to one embodiment, said two distinct planes correspond to a section of the light-emitting diode perpendicularly to the first direction.

According to one embodiment, the implanted portion is an area of the light-emitting diode extending transversely to the first direction, and wherein ions are implanted where each implanted ion forms:

- a complex with a doping element, doping according to the second conductivity type of the semiconductor shell being neutralised at the level of the passivated portion, or
- deep levels which limits or suppresses the mobility of the positive or negative charge carriers, without these deep levels serving as non-radiative recombination centres.

According to one embodiment, each ion implanted in the implanted portion forms a complex with a dopant element, so that doping according to the first conductivity type of the semiconductor core is neutralised at the level of the first implanted portion.

According to one embodiment, the ion implantation comprises the implantation of at least one ion selected from among the argon ions, the helium ions, the neon ions, the oxygen ions, the germanium ions, the arsenic ions, the phosphorous ions, the boron ions, the magnesium ions, the silicon ions, the aluminium ions, the fluorine ions, the nitrogen ions, and the hydrogen ions.

Thus, it is possible to implant ions in deep levels, so as to neutralise the free charge carriers of the semiconductor core and/or of the semiconductor shell at the level of the first implanted portion and/or the passivated portion.

According to one embodiment, the implanted ions are hydrogen ions.

According to an embodiment wherein the semiconductor core is primarily formed by gallium nitride doped with magnesium, the implanted hydrogen ions form with the magnesium dopant, a magnesium hydrogen complex Mg—H. Thus, the ion implantation allows neutralising the P doping with magnesium, and thus allows passivating the first implanted portion, in order to reduce its conductivity.

By "compound primarily formed by a material", it should be understood that a compound comprises a proportion higher than or equal to 95% of said material, this proportion being preferably higher than 99%.

According to one embodiment, at least one semiconductor element selected from the group comprising the semiconductor core and the semiconductor shell has a wired, conical, frustoconical, pyramidal, or truncated pyramid shape.

Hence, it should be understood that the three-dimensional shape of the light-emitting diode depends on the shape of the semiconductor core and on the shape of the semiconductor shell.

According to one embodiment, the light-emitting diode has a microwire, nanowire, cone, frustoconical, or pyramidal shape.

According to one embodiment, the implanted portion is positioned, along the first direction, so as to incorporate the proximal portion of the light-emitting diode.

According to one embodiment, the implanted portion is separate from the proximal portion.

The aim of the disclosure may also be achieved thanks to the implementation of an optoelectronic member comprising a support extending according to a plane, and at least one light-emitting diode such any one of those described before, the implanted portion of said at least one light-emitting diode being substantially parallel to the support plane.

According to one embodiment, the first direction is perpendicular to the plane of the support.

Advantageously, the optoelectronic member may comprise a filler interlayer (for example the 5 lanarization layer) disposed between two light-emitting diodes. Said filler interlayer may have an appropriate ion implantation response profile, defining the implantation depth as a function of the implantation energy, typically similar to that one of the materials making up the light-emitting diode, and thus comprise an interlayer portion implanted parallel to the support plane and in the continuation of the implanted portion of the light-emitting diodes. In this manner, it is possible to determine and control the ion implantation depth according to the implantation energy. Thus, it is possible to control the ion implantation when it is implemented on a continuous transverse portion of the optoelectronic member. The previously-described arrangements also apply to the optoelectronic device of the disclosure.

Indeed, the aim of the disclosure may also be achieved thanks to the implementation of an optoelectronic device comprising:

- a support having a support face;
- at least one light-emitting diode such as one of those described before, directly or indirectly cooperating with said support face;
- a first conductive element electrically connected to the semiconductor core of the light-emitting diode, and
- a second conductive element electrically connected to the semiconductor shell of the light-emitting diode.

The previously-described arrangements allow providing an optoelectronic device with light-emitting diodes adapted to perform the conversion of an electric signal into a light radiation.

The optoelectronic device may further have one or more of following features, considered separately or in combination.

According to one embodiment, said at least one light-emitting diode is disposed over the support face so that the proximal portion of said at least one light-emitting diode is directed towards the support face of the support, and so that the first direction extends transversely to the support face.

According to one embodiment, the semiconductor core is disposed over the support face so as to be in contact with the support by the proximal portion.

According to one embodiment, the semiconductor shell completely covers the semiconductor core when it is in contact with the support face of the support.

According to one embodiment, the support is secured to a base ensuring general mechanical holding of the optoelectronic device.

Finally, the aim of the disclosure may be achieved thanks to the implementation of a method for manufacturing an optoelectronic device comprising the following steps:

- a step of providing an initial optoelectronic device comprising:
  - a support having a support face; and
  - at least one light-emitting diode cooperating directly or indirectly with said support face, said at least one light-emitting diode having a three-dimensional shape, and comprising a height extending according to a first direction between a proximal portion and a distal portion opposite to said proximal portion along said first direction, said light-emitting diode comprising a semiconductor core doped according to a first conductivity type, the proximal portion corresponding to a growth base of said semiconductor core, and a semiconductor shell doped according to a second conductivity type opposite to the first conductivity type, said semiconductor shell covering at least partially said semiconductor core,
- a step of passivating the at least one light-emitting diode to form the optoelectronic device, in which the at least one light-emitting diode is passivated over an implanted portion extending over an implanted height counted along the first direction, said implanted height being strictly smaller than the height of the light-emitting diode, said implanted portion being disposed between the distal portion and the proximal portion, and being separate from the distal portion, so that the implanted portion delimits within the semiconductor shell at least one passivated portion separate from the distal portion of the light-emitting diode, the semiconductor shell comprising at least one active portion delimited at least partially by said at least one passivated portion, said at least one passivated portion having a conductivity strictly lower than a conductivity of said at least one active portion.

The previously-described arrangements allow manufacturing an optoelectronic device comprising at least one light-emitting diode comprising an implanted portion having a locally reduced conductivity. The three-dimensional shape of the light-emitting diode allows delimiting an implanted portion in which the conductivity is reduced, during the passivation step.

By "passivated" or "neutralised" portion, or element, it should be understood that said portion or said element could become insulating after having undergone the passivation step.

The manufacturing method may further have one or more of the following features, considered separately or in combination.

According to one embodiment, during the passivation step, the at least one light-emitting diode is passivated so that the implanted portion also delimits within the semiconductor core at least one first implanted portion separate from the distal portion of the light-emitting diode, the semiconductor core comprising at least one first non-implanted portion delimited at least partially by said at least one first implanted portion, said at least one first implanted portion having an ion concentration strictly different from an ion concentration of said at least one first non-implanted portion.

According to one embodiment, during the step of providing an initial optoelectronic device, said initial optoelectronic device comprises a first conductive element electrically connected to the semiconductor core of the light-emitting diode, and a second conductive element electrically connected to the semiconductor shell of the light-emitting diode.

According to one embodiment, during the step of providing an initial optoelectronic device, said at least one light-emitting diode is disposed over the support face of the support so that the proximal portion of the at least one light-emitting diode is directed towards the support face of the support, and so that the first direction extends transversely to said support face.

According to one embodiment, the at least one light-emitting diode having a three-dimensional shape may be manufactured in accordance with one of the embodiments described in the documents FR3031242A1, or FR3098013A1.

According to one embodiment, the passivation step is implemented by an ion implantation, in a manner allowing neutralising doping according to the second conductivity type of the semiconductor shell at the level of the passivated portion.

Thus, and advantageously, it is possible to modify the conductivity of the first implanted portion at the level of the passivated portion by an ion passivation.

According to one embodiment, the ion implantation is carried out by implantation of ions through the light-emitting diode, and/or through the optoelectronic device.

According to one embodiment, the passivation step comprise the implantation of at least one ion selected from among the argon ions, the helium ions, the neon ions, the oxygen ions, the germanium ions, the arsenic ions, the phosphorous ions, the boron ions, the magnesium ions, the silicon ions, the aluminium ions, the fluorine ions, the nitrogen ion, and the hydrogen ions.

Thus, it is possible to implant ions in deep levels, so as to neutralise the free charge carriers of the semiconductor core and/or of the semiconductor shell at the level of the first implanted portion and/or the passivated portion.

Synergically, the neutralisation of the free charge carriers during the passivation step allows making the semiconductor core and the semiconductor shell less conductive without creating non-radiative carriers recombination centres, which would be detrimental in the case of optoelectronic devices.

Advantageously, the step of passivation by ion implantation of a three-dimensional light-emitting diode allows simultaneously implanting ions in the semiconductor core and in the semiconductor shell.

Thus, the passivation step is implemented by ion implantation in volume. Thus, it is possible to simultaneously implant the semiconductor shell and the semiconductor core, by electrically passivating only the semiconductor element (amongst the semiconductor shell and the semiconductor core) that has a p-type conductivity type. This allows performing a differential deactivation of the charge carriers between the—doped semiconductor portion, and the N-doped semiconductor portion.

According to one embodiment, an implanted dose of ions is comprised between $10^{11}$ at/cm$^2$ and $10^{14}$ at/cm$^2$. For example, said implanted dose of ions may be defined according to the mass of the implanted ion, and according to the material thickness to be crossed.

According to one embodiment, the passivation step is implemented over an implanted height, counted along the first direction X, smaller than 500 nm. Thus, it is possible to from the implanted portion, for example by ion implantation, using implantation energy ranges commonly used in microelectronics processes.

According to one embodiment, an implantation energy is comprised between 1 keV, and 500 keV. For example, said implantation energy may be defined according to the mass of the implanted ion, and according to the material thickness to be crossed.

According to one embodiment, the passivation step is implemented by a hydrogen ion implantation.

Advantageously, a hydrogen implantation, i.e. an implantation of H+ ions, allows passivating more efficiently a P-doped material than an N-doped material, using small ion implantation doses.

In this manner, it is possible to selectively or differentiately passivate, a P-doped material rather than an N-doped material in one step of the method.

According to one embodiment, the passivation step is implemented by ion implantation starting from the proximal portion towards the distal portion.

According to one embodiment, the passivation step is implemented by ion implantation starting from the distal portion towards the proximal portion.

According to one embodiment, the ion implantation is implemented starting from a rear face of the support, said rear face of the substrate being opposite to the support face of the support.

According to one embodiment, the ion implantation is implemented starting from the support face.

According to one embodiment, the passivation step is implemented at the level of the proximal portion, so that the proximal portion is included in the implanted portion.

Thus, and advantageously, it is possible to neutralise the conductivity at the level of the proximal portion. For example, in the case of a microwire, nanowire, cone, truncated cone or pyramidal shaped three-dimensional light-emitting diode, it is possible to neutralise the proximal portion, in order to emit light only at the level of the distal portion.

Thus, any parasitic crystalline defect possibly present at the level of the proximal portion will be neutralised. It is then possible to improve the emission efficiency and the light extraction of the three-dimensional light-emitting diode.

According to one embodiment, the first conductive element is electrically connected to the semiconductor core at the level of the proximal portion, for example through open-through openings formed through the support. Thus, in the case where the semiconductor core is N-doped, and in the case where the passivation step has a low impact on the conductivity of the semiconductor core, it is possible to guarantee a good electrical connection between the semiconductor core and the first conductive element, while passivating the passivated portion.

According to one embodiment, the passivation step is implemented so that the implanted portion is separate from the proximal portion.

The previously-described arrangements allow providing a light-emitting diode having at least two first active portions and at least two active portions separated by the implanted portion. Each first non-implanted portion adjacent to an active portion will then be able to emit light, by conversion of electrical energy into light radiation.

According to one embodiment, the manufacturing method further comprises a 10 lanarization step in which a 10 lanarization layer is deposited at the level of the support face of the support until a thickness of the 10 lanarization layer, viewed according to the first direction and counted starting from the support face, is at least equal to the height of the at least one light-emitting diode.

According to one embodiment, the 10 lanarization layer comprises an insulating material, for example silicon dioxide $SiO_2$.

According to one embodiment, the 10 lanarization step is implemented so as to cover the at least one light-emitting diode.

According to one embodiment, the 10 lanarization step is implemented before the passivation step.

In this manner, the 10 lanarization step allows streamlining a thickness of the optoelectronic device along the first direction so as to control the implantation depths during the passivation step.

According to one embodiment, the manufacturing method further comprises an annealing step in which the optoelectronic device is heated up to an annealing temperature, said annealing temperature being lower than 500° C. and in particular between 400° C. and 500° C.

Advantageously, the annealing step allows regenerating the N-doped semiconductor element, like for example the semiconductor core, in order to limit the impact of the passivation step on this semiconductor element. This also allows obtaining a differential passivation between the N-doped semiconductor element, and the P-doped semiconductor element.

According to one embodiment, the implanted portion corresponds to the semiconductor shell only, via the front face, or via the rear face, the semiconductor core being masked locally by a resin, thus preventing the implantation of the semiconductor core.

BRIEF DESCRIPTION OF THE DRAWINGS

Other aspects, aims, advantages and features of the disclosure will appear better upon reading the following detailed description of preferred embodiments thereof, given as a non-limiting example, and made with reference to the appended drawings wherein.

DETAILED DESCRIPTION

Figure 1:
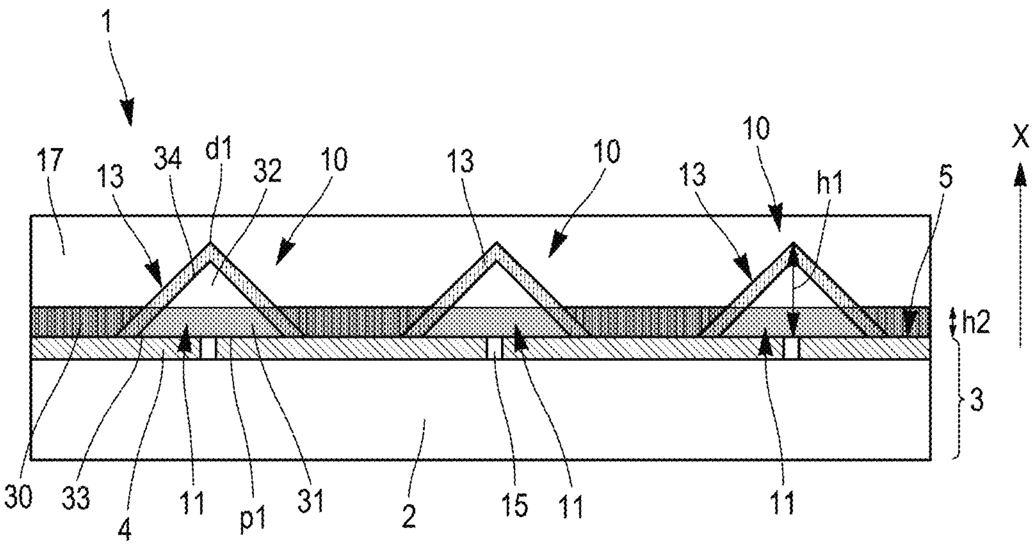
FIG. 1 is a schematic view of an optoelectronic device according to a particular embodiment of the disclosure.

In the figures and in the following description, the same references represent identical or similar elements. In addition, the different elements are not represented to scale so as to favour clarity of the figures. Moreover, the different embodiments and variants do not exclude one another and could be combined together.

As illustrated in FIGS. 1 to 8, the disclosure relates to a light-emitting diode 10, an optoelectronic member, and an optoelectronic device 1 comprising at least one such light-emitting diode 10.

The optoelectronic device 1 comprises a support 3, 8 generally including a stack of a monolithic layer (not represented), a lower electrode layer 2 which may be a conductive germination layer, and a first electrically-insulating layer 4. The monolithic layer may be formed in a semiconductor material, whether doped or not, for example silicon or germanium, and more particularly monocrystalline silicon. It may also be formed of crystallised alumina and possibly of a III-V semiconductor material, for example GaN. Alternatively, it may consist of a Silicon-On-Insulator or "SOI" type substrate. Alternatively, the monolithic layer may be formed of an electrically-insulating material. The lower electrode layer 2 is intended to form one or several first lower electrode(s) and may be used as a germination layer for the growth of portions of light-emitting diodes 10. In the following description, reference is made to a proximal portion p1 of the light-emitting diode. This proximal portion p1 corresponds to the portion of the light-emitting diode 10 that is directed towards the growth substrate (or for example the lower electrode layer 2) starting from which the portions of the light-emitting diode 10 have grown. This lower electrode layer 2 may be continuous or discontinuous. The material composing the lower electrode layer 2 may be a nitride, a carbide or a boride of a transition metal from the IV, V or VI columns of Mendeleev's periodic table of elements or a combination of these compounds. In practice, in the following manufacturing method, this germination lower electrode layer 2 may be completed or replaced with metals like aluminium or copper. The first electrically-insulating layer 4 may comprise an electrically-insulating layer which covers the lower electrode layer 2. Besides its electric insulation properties, it forms a growth mask enabling the growth, for example epitaxial, of doped portions of the light-emitting diodes 10 starting from open-through openings 15 delimited by this growth mask locally opening onto the lower electrode layer 2. According to a non-limiting variant, it may be provided for the support 3, 8 comprising a base 8 ensuring general mechanical holding of the optoelectronic device 1. For example, this base 8 may be attached at the level of the distal portion d1 of the light-emitting diode 10 and form the support 3, 8. In this case, the substrate having been used for the growth of the doped portions (like for example the semiconductor core 11, and the semiconductor shell 13 which will be described later on) may be suppressed. Thus, the proximal portion p1 corresponds to the portion of the light-emitting diode 10 the farthest from the base 8 forming the support 3, 8; and the distal portion d1 is the closest to the base 8 forming the support 3, 8.

Figure 2:
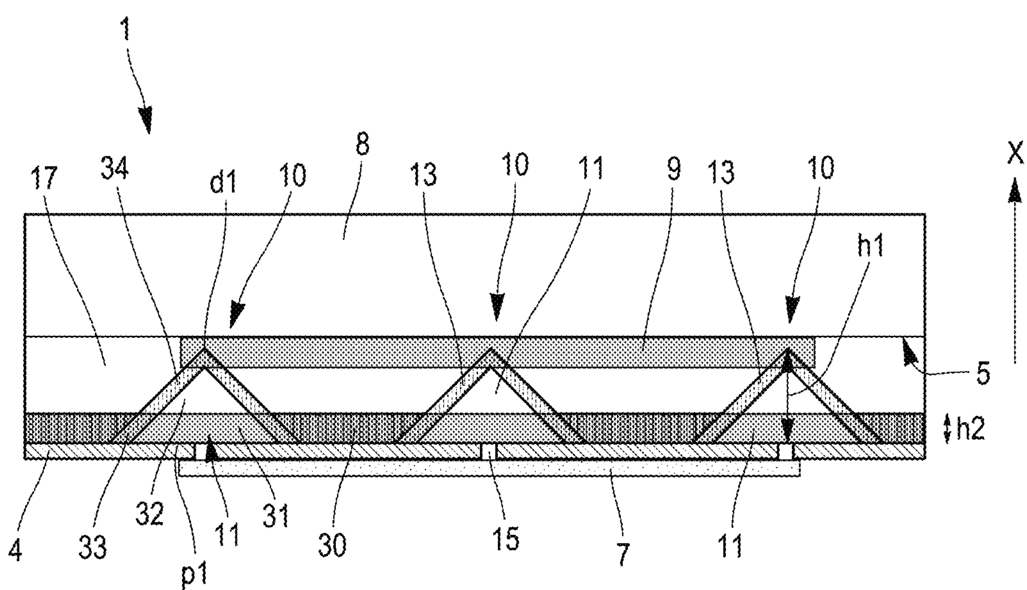
FIG. 2 is a schematic view of an optoelectronic device according to a particular embodiment of the disclosure.

The support 3, 8 of the optoelectronic device 1 according to the disclosure has a support face 5 which cooperates directly or indirectly with at least one light-emitting diode 10 according to the disclosure. For example, as illustrated in FIG. 1, the light-emitting diodes 10 may be disposed over the support face 5 of the support 3, 8, they therefore cooperate directly with the support face 5 of the support 3, 8. Alternatively and as represented in FIG. 2, it is the base 8 which forms the support 3, 8. In this case, the support face 5 is directed towards the distal portion d1 of the light-emitting diodes, and cooperates with these indirectly, for example through a planarisation layer 17 which will be described later on. Each light-emitting diode 10 has a three-dimensional shape and comprises a height h1 extending according to a first direction denoted "X" between the proximal portion p1 (defined hereinabove) and a distal portion d1 opposite to said proximal portion p1 along said first direction X. As indicated before, the proximal portion p1 corresponds to the portion of the light-emitting diode 10 directed towards the growth substrate from which the portions of the light-emitting diode 10 have grown.

According to one embodiment, the light-emitting diode 10 is disposed over the support face 5 so that the proximal portion p1 of said at least one light-emitting diode 10 is directed towards the support face 5 of the support 3, 8. In general, the light-emitting diodes 10 are disposed so that the first direction X extends transversely to the support face 5, for example perpendicularly. The light-emitting diode 10 comprises a semiconductor core 11 doped according to a first conductivity type, and a semiconductor shell 13 doped according to a second conductivity type opposite to the first conductivity type, the semiconductor shell 13 covering at least partially the semiconductor core 11. In particular, it may be provided for the semiconductor shell 13 covering the semiconductor core 11 on the distal portion d1 side, and not covering the semiconductor core 11 on the proximal portion p1 side. As indicated in the figures, the proximal portion p1 may for example correspond to the growth base of the semiconductor core 11. In general, the semiconductor shell 13 comprises the distal portion d1. More specifically, the distal portion d1 may correspond to one end of the semiconductor shell 13 disposed on a side opposite to that of the semiconductor shell 13 which is directed towards the semiconductor core 11.

The optoelectronic device 1 further comprises a first conductive element 7 electrically connected to the semiconductor core 11 of the light-emitting diode 10, and a second conductive element 9 electrically connected to the semiconductor shell 13 of the light-emitting diode 10. As one could see in the non-limiting embodiment represented in FIG. 2, the second conductive element 9 is disposed at the level of the support face 5 of the support 3, 8, so as to be electrically connected to the semiconductor shell 13, and the first conductive element 7 is disposed over an opposite face of the first electrically-insulating layer 4. The electrical connection between the first conductive element 7 and the semiconductor core 11 is achieved through open-through openings 15, crossing the first electrically-insulating layer 4. To improve clarity of the figures, the first conductive element 7, and the second conductive element 9 are not systematically represented. However, it should be understood that other embodiments could be implemented to enable the electrical connection between the first conductive element 7 and the semiconductor core 11, and between the second conductive element 9 and the semiconductor shell 13.

Figure 6:
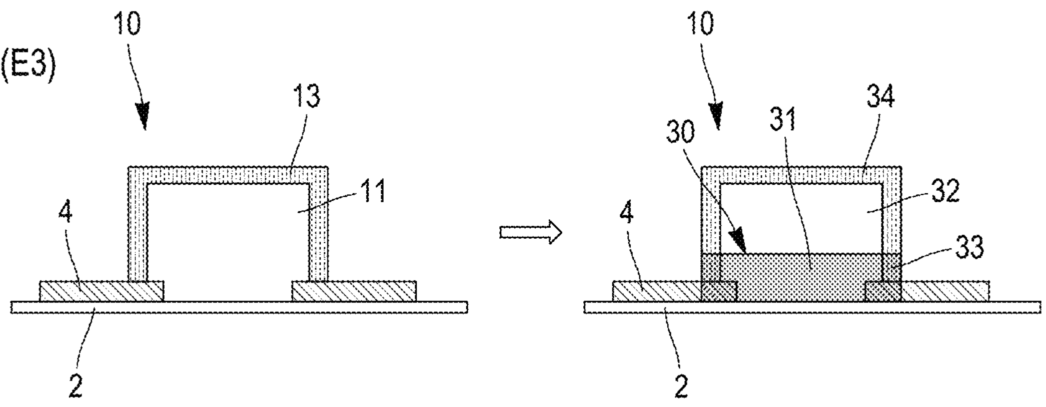
FIG. 6 is a schematic view of the passivation step according to a particular embodiment of the disclosure.
Figure 7:
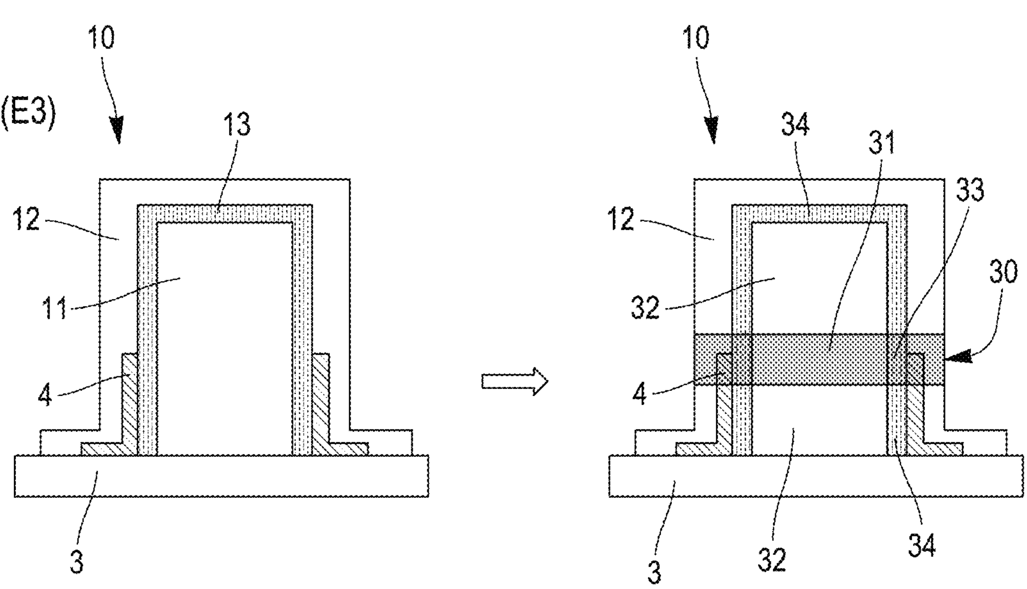
FIG. 7 is a schematic view of the passivation step according to a particular embodiment of the disclosure.

Finally, and as illustrated in FIG. 7, the optoelectronic device may comprise a conductive transparent electrode 12 configured to ensure an electrical connection between the second conductive element 9 and the semiconductor shell 13. However, it should be understood that such a conductive transparent electrode 12 may be adapted to any other embodiment, like those represented in FIGS. 1 to 7.

The previously-described arrangements allow providing an optoelectronic device 1 with light-emitting diodes 10 adapted to perform the conversion of an electric signal into a light radiation.

Figure 8:
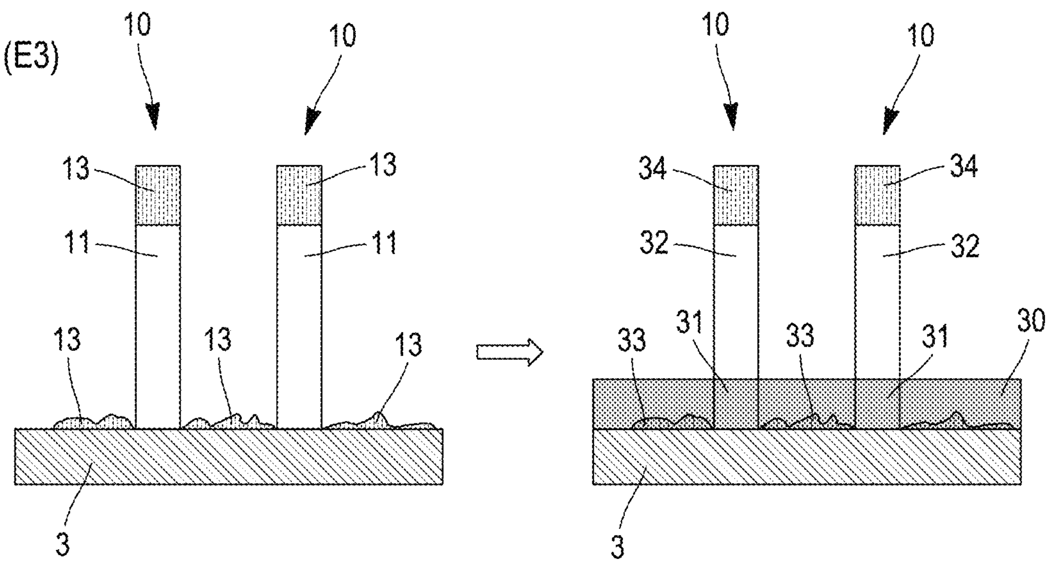
FIG. 8 is a schematic view of the passivation step according to a particular embodiment of the disclosure.

As indicated before, the light-emitting diode 10 has a three-dimensional shape, said three-dimensional shape may be in the form of a microwire, a nanowire, a cone, a truncated cone, a pyramid, or a truncated pyramid. In general, said three-dimensional shape of the light-emitting diode 10 depends on the shape of the semiconductor core 11 and on the shape of the semiconductor shell 13. Thus, if at least one semiconductor element selected from the group comprising the semiconductor core 11 and the semiconductor shell 13 has a wire-like, conical, frustoconical, pyramidal or truncated pyramidal shape, the shape of the light-emitting diode 10 will be similar. For example, and referring to FIGS. 1 to 5, the semiconductor core 11 may have a pyramidal or conical shape, and may be disposed over the support face 5, so as to be in contact with the support 3, 8 by the proximal portion p1. Alternatively and as represented in FIGS. 6 to 8, the semiconductor core 11 may have a nanowire-like shape. In the embodiments of FIG. 1 to 7, the semiconductor shell 13 completely covers the semiconductor core 11 when it is in contact with the support face 5 of the support 3, 8, so that the semiconductor shell 13 conforms to the pyramidal, conical or wire-like shape of the semiconductor core 11. Yet, according to the embodiment of FIG. 8, the semiconductor shell 13 covers on the one hand partially the semiconductor core 11 at the level of the distal portion d1 and, on the other hand, sidewalls of the semiconductor core 11, in the form of residual deposits, separate, or not, from the distal portion d1.

According to one embodiment, the semiconductor core 11 comprises N-doped gallium nitride GaN, and the semiconductor shell 13 comprises P-doped gallium nitride GaN. Alternatively, at least one semiconductor element selected amongst the semiconductor core 11 and the semiconductor shell 13 comprises gallium arsenide GaAs, whether doped or not, or gallium-indium arsenide GaInAs, whether doped or not, or another III-V material. By "P doping" or "P doped", it should be understood that a semiconductor material comprises a large amount of electron-acceptor atoms allowing obtaining a lower density of free electrons, and therefore an excess of holes, said holes being positively charged. For example, an electron-acceptor atom may be magnesium. By "N doping" or "N doped", it should be understood that a semiconductor material comprises a large amount of electron-donor atoms in order to obtain a higher density of free electrons, which are negatively charged. For example, an electron-donor atom may be silicon or germanium.

The light-emitting diode 10 further comprises, an implanted portion 30 extending over an implanted height h2 counted along the first direction X, said implanted height h2 being strictly smaller than the height h1 of the diode. For example, the implanted height h2, counted along the first direction X, is smaller than 500 nm.

The implanted portion 30 is disposed between the distal portion d1 and the proximal portion p1, and is separate from the distal portion d1. According to the variants represented in FIGS. 1 to 4, 6, and 8, the implanted portion 30 is positioned, along the first direction X, so as to incorporate the proximal portion p1 of the light-emitting diode 10. Alternatively, and as represented in FIGS. 5 and 7, the implanted portion 30 is separate from the proximal portion p1. By "passivated" or "neutralised" portion, or element, it should be understood that said portion or said element has the absolute value of its conductivity decreasing. For example, said portion or said element may become insulating when it is passivated. Consequently, the implanted portion 30 is advantageously separate from the distal portion d1 so as to enable the conversion of an electric signal into a light radiation at the level of said distal portion d1.

The implanted portion 30 may delimit within the semiconductor core 11 at least one first implanted portion 31 separate from the distal portion d1 of the light-emitting diode 10. Consequently, the semiconductor core 11 also comprises at least one first non-implanted portion 32 delimited at least partially by said at least one first implanted portion 31. Said at least one first implanted portion 31 has an ion concentration strictly different from an ion concentration of said at least one first non-implanted portion 32. By "ionic concentration" is meant the concentration of the implanted ions.

The implanted portion 30 also delimits within the semiconductor shell 13 at least one passivated portion 33 separate from the distal portion d1 of the light-emitting diode 10. Consequently, the semiconductor shell 13 also comprises at least one active portion 34 delimited at least partially by said at least one passivated portion 33. Said at least one passivated portion 33 has a conductivity strictly lower than a conductivity of said at least one active portion 34.

In general, the implanted portion 30 is an area of the light-emitting diode 10 in which ions are implanted, where each implanted ion forms a complex with a dopant element, doping according to the first conductivity type of the semiconductor core 11 then being neutralised at the level of the first implanted portion 31, and/or doping according to the second conductivity type of the semiconductor shell 13 being neutralised at the level of the passivated portion 33. It is also possible that the ions implanted in the implanted portion 30 form deep levels. This results in limiting or suppressing the mobility of the positive or negative charge carriers, without these deep levels serving as a non-radiative recombination centre. For example, the ion implantation comprises the implantation of at least one ion selected from among the argon ions Ar, the helium ions He, the neon ions Ne, the oxygen ions O, the germanium ions Ge, the arsenic ions As, the phosphorous ions P, the boron ions B, the magnesium ions Mg, the silicon ions Si, the aluminium ions Al, the fluorine ions F, the nitrogen ions N, and the hydrogen ions H. Thus, it is possible to implant ions in deep levels, so as to neutralise the free charge carriers of the semiconductor core 11 and/or of the semiconductor shell 13 at the level of the first implanted portion 31 and/or the passivated portion 33.

According to an embodiment wherein the semiconductor core 11 is primarily formed by gallium nitride doped with magnesium, the implanted hydrogen ions H+ form with the magnesium dopant, a magnesium hydrogen complex Mg—H. Thus, the ion implantation allows neutralising the P doping with magnesium, and thus allows passivating the first implanted portion 31, in order to reduce its conductivity. By "compound primarily formed by a material", it should be understood that a compound comprises a proportion higher than or equal to 95% of said material, this proportion being preferably higher than 99%.

The previously-described arrangements allow providing a light-emitting diode 10 comprising an implanted portion 30 having a locally reduced conductivity. The three-dimensional shape of the light-emitting diode 10 also allows defining more simply an implanted portion 30 in which the conductivity is reduced.

In a generic manner, the disclosure may also comprise an optoelectronic member comprising a support 3, 8 extending according to a plane, and at least one light-emitting diode 10 as described before in which the implanted portion 30 is substantially parallel to the plane of the support 3, 8. Advantageously, the optoelectronic member may comprise a filler interlayer (for example the planarisation layer 17) disposed between two light-emitting diodes 10. Said filler interlayer may have an appropriate ion implantation response profile, defining the implantation depth as a function of the implantation energy, typically similar to that one of the materials making up the light-emitting diode 10, and thus comprise an interlayer portion implanted parallel to the support plane 3, 8 and in the continuation of the implanted portion 30 of the light-emitting diodes 10. In this manner, it is possible to determine and control the ion implantation depth according to the implantation energy. Thus, it is possible to control the ion implantation when it is implemented on a continuous transverse portion of the optoelectronic member. The previously-described arrangements also apply to the optoelectronic device 1 of the disclosure.

FIGS. 3 to 8 illustrate the steps of a manufacturing method of the disclosure, allowing manufacturing an optoelectronic device 1 such as one of the previously-described ones.

First of all, the manufacturing method comprises a step E1 of providing an initial optoelectronic device comprising a support 3, 8 having a support face 5 and at least one light-emitting diode 10 cooperating directly or indirectly with said support face 5. Said at least one light-emitting diode 10 has a three-dimensional shape, and comprises a height h1 extending according to a first direction X between a proximal portion p1 and a distal portion d1 opposite to said proximal portion p1 along said first direction X. Said light-emitting diode 10 comprises a semiconductor core 11 doped according to a first conductivity type, and a semiconductor shell 13 doped according to a second conductivity type opposite to the first conductivity type, said semiconductor shell 13 covering at least partially said semiconductor core 11. According to a first variant, said at least one light-emitting diode 10 is disposed over said support face 5 of the support 3, 8 so that the proximal portion p1 of the at least one light-emitting diode 10 is directed towards the support face 5 of the support 3, 8, and so that the first direction X extends transversely to said support face 5. However, it may be provided that the light-emitting diode 10 is directed in the other way with respect to the support 3, 8. According to one embodiment, the initial optoelectronic device provided during the provision step E1 comprises a first conductive element 7 electrically connected to the semiconductor core 11 of the light-emitting diode 10, and a second conductive element 9 electrically connected to the semiconductor shell 13 of the light-emitting diode 10.

According to one embodiment, the at least one light-emitting diode 10 having a three-dimensional shape may be manufactured in accordance with one of the embodiments described in the documents FR3031242A1, or FR3098013A1. Moreover, and as illustrate before, the first conductive element 7 may be electrically connected to the semiconductor core 11 at the level of the proximal portion p1, for example through open-through openings 15 formed through the support 3, 8.

Figure 3:
FIG. 3 is a schematic view of some steps of the manufacturing method according to a particular embodiment of the disclosure.
Figure 3:
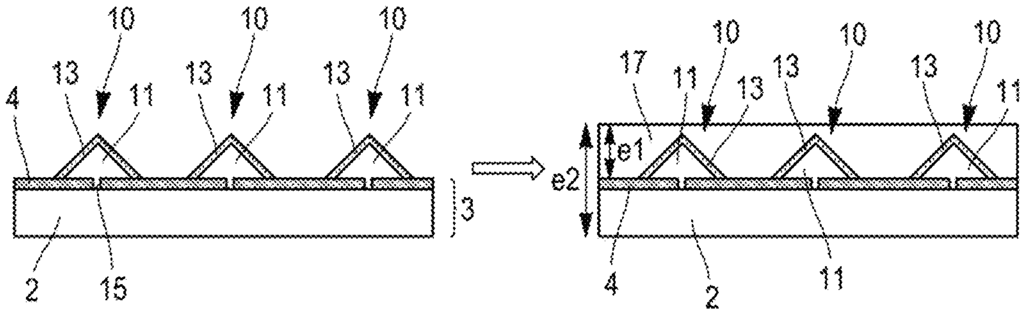

FIG. 3 illustrates a planarisation step E2 in which a planarisation layer 17 is deposited at the level of the support face 5 of the support 3, 8 until a thickness e1 of the planarisation layer 17, viewed according to the first direction X and counted starting from the support face 5, namely at least equal to the height h1 of the at least one light-emitting diode 10. For example, the planarisation layer 17 comprises an insulating material, for example silicon dioxide $SiO_2$. Advantageously, the planarisation step E2 is implemented so as to cover the at least one light-emitting diode 10.

Such a planarisation step E2 may be implemented before a passivation step E3 of the manufacturing method which will be described hereinafter. Advantageously, the planarisation step E2 allows streamlining a thickness e2 of the optoelectronic device 1 along the first direction X, which allows better controlling ion implantation depths in particular during the passivation step E3. This also allows obtaining a differential passivation between the N-doped semiconductor element, and the P-doped semiconductor element.

FIGS. 4 to 8 illustrate said passivation step E3 in which the at least one light-emitting diode 10 is passivated over an implanted portion 30 extending over an implanted height h2 counted along the first direction X, said implanted height h2 being strictly smaller than the height h1 of the light-emitting diode 10. For example, the passivation step E3 may be implemented over an implanted height h2, counted along the first direction X, smaller than 500 nm. By "passivated" or "neutralised" portion, or element, it should be understood that said portion or said element has the absolute value of its conductivity decrease. For example, said portion or said element may become insulating after having undergone the passivation step E3.

The implanted portion 30 is disposed between the distal portion d1 and the proximal portion p1, and being separate from the distal portion d1. According to the variants represented in FIGS. 4, 6, and 8, the passivation step E3 is implemented at the level of the proximal portion p1, so that the proximal portion p1 is included in the implanted portion 30. Thus, and advantageously, it is possible to neutralise the conductivity at the level of the proximal portion p1. For example, in the case of a microwire, nanowire, cone, truncated cone or pyramidal shaped three-dimensional light-emitting diode 10, it is possible to neutralise the proximal portion p1, in order to emit light only at the level of the distal portion d1. Thus, any parasitic crystalline defect, like a residual deposit of the semiconductor shell 13, possibly present at the level of the proximal portion p1, may be neutralised. It is then possible to improve the emission efficiency and the light extraction of the three-dimensional light-emitting diode 10.

In general, the passivation step E3 is implemented so that the implanted portion 30 delimits within the semiconductor core 11 at least one first implanted portion 31 separate from the distal portion d1 of the light-emitting diode 10. The semiconductor core 11 then comprise at least one first non-implanted portion 32 delimited at least partially by said at least one first implanted portion 31, said at least one first implanted portion 31 having an ion concentration strictly different from an ion concentration of said at least one first non-implanted portion 32.

Moreover, the passivation step E3 is implemented so that the implanted portion 30 also delimits within the semiconductor shell 13 at least one passivated portion 33 separate from the distal portion d1 of the light-emitting diode 10. The semiconductor shell 13 then comprises at least one active portion 34 delimited at least partially by said at least one passivated portion 33, said at least one passivated portion 33 having a conductivity strictly lower than a conductivity of said at least one active portion 34.

In the case where the first conductive element 7 is electrically connected to the N-doped semiconductor core 11, at the level of the proximal portion p1, for example through the open-through openings 15 formed through the support 3, 8, and in the case where the passivation step E3 has a low impact on the conductivity of the semiconductor core 11, it is possible to guarantee a good electrical connection between the semiconductor core 11 and the first conductive element 7, while passivating the passivated portion 33.

According to the embodiments illustrated in FIGS. 5 and 7, the passivation step E3 is implemented so that the implanted portion 30 is separate from the proximal portion p1. Thus, it is possible to provide a light-emitting diode 10 having at least two first active portions 32 and at least two active portions 34 separated by the implanted portion 30. Each first non-implanted portion 32 adjacent to an active portion 34 will then be able to emit light, by conversion of electrical energy into light radiation.

Figure 4:
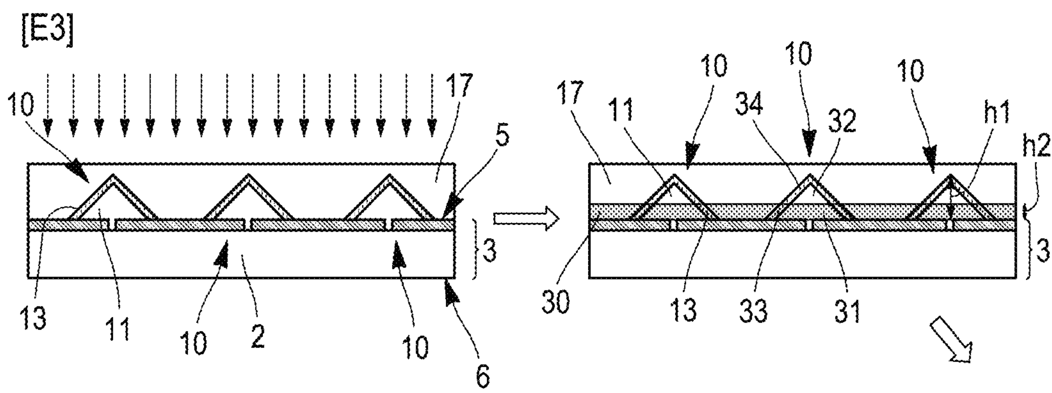
FIG. 4 is a schematic view of some steps of the manufacturing method according to a particular embodiment of the disclosure.
Figure 4:
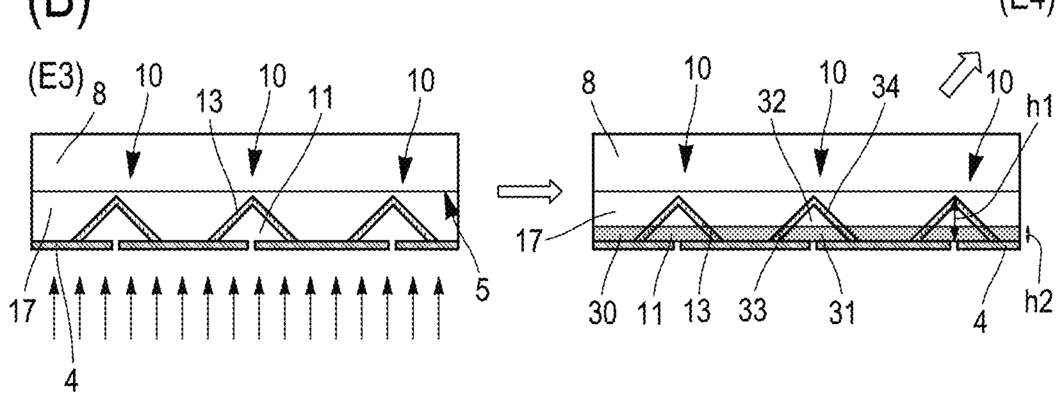
Figure 5:
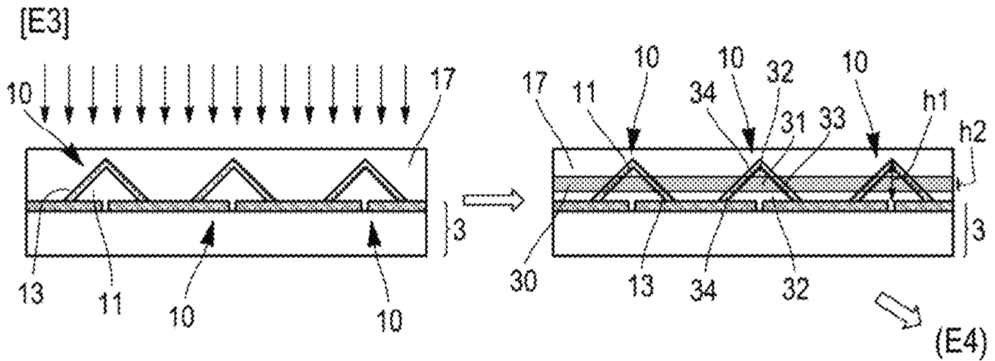
FIG. 5 is a schematic view of some steps of the manufacturing method according to a particular embodiment of the disclosure.

According to the two non-limiting variants represented in FIGS. 4 and 5, the passivation step E3 is implemented by an ion implantation, in a manner allowing neutralising doping according to the first conductivity type of the semiconductor core 11 at the level of the first implanted portion 31, and/or in a manner allowing neutralising doping according to the second conductivity type of the semiconductor shell 13 at the level of the passivated portion 33. Thus, and advantageously, it is possible to modify the conductivity of the first implanted portion 31 and of the passivated portion 33 by an ion implantation. For example, the ion implantation is carried out by ion implantation through the light-emitting diode 10, and/or through the optoelectronic device 1. Advantageously, the passivation step E3 by ion implantation of a three-dimensional light-emitting diode 10 allows simultaneously implanting ions in the semiconductor core 11 and in the semiconductor shell 13. Thus, the passivation step E3 is implemented by ion implantation in volume. Thus, it is possible to simultaneously implant the semiconductor shell 13 and the semiconductor core 11, by electrically passivating only the semiconductor element (amongst the semiconductor shell 13 and the semiconductor core 11) that has a P-type conductivity type. This allows performing a differential deactivation of the charge carriers between the P-doped semiconductor portion, and the N-doped semiconductor portion.

According to the variants illustrated in FIGS. 4 A and 5, the passivation step E3 is implemented by ion implantation staring from the distal portion d1 towards the proximal portion p1.

Alternatively, and as illustrated in FIG. 4 B, the ion implantation implemented during the passivation step E3 is carried out starting from the proximal portion p1 towards the distal portion d1. According to a non-represented embodiment, it may also be provided for the ion implantation being implemented starting from a rear face 6 of the support 3, 8, said rear face 6 of the support 3, 8 being opposite to the support face 5 of the support 3, 8.

In general, the passivation step E3 is implemented over an implanted height h2, counted along the first direction X, smaller than 500 nm. Thus, it is possible to from the implanted portion 30, for example by ion implantation, using implantation energy ranges commonly used in microelectronics processes. In particular, an implantation energy may be comprised between 1 keV, and 500 keV. For example, said implantation energy may be defined according to the mass of the implanted ion, and according to the material thickness to be crossed.

In the case of the implementation of the passivation step E3 by ion implantation, it may be provided for using at least one ion selected from among the argon ions Ar, the helium ions He, the neon ions Ne, the oxygen ions O, the germanium ions Ge, the arsenic ions As, the phosphorous ions P, the boron ions B, the magnesium ions Mg, the silicon ions Si, the aluminium ions Al, the fluorine ions F, the nitrogen ions N, and the hydrogen ions H. Thus, it is possible to implant ions in deep levels, so as to neutralise the free charge carriers of the semiconductor core 11 and/or of the semiconductor shell 13 at the level of the first implanted portion 31 and the passivated portion 33. Synergically, the neutralisation of the free charge carriers during the passivation step E3 allows making the semiconductor core 11 and the semiconductor shell 13 less conductive without creating non-radiative carriers recombination centres, which would be detrimental in the case of optoelectronic devices 1. For example, an implanted dose of ions is comprised between $10^{11}$ at/cm$^2$ and $10^{14}$ at/cm$^2$. For example, said implanted dose of ions may be defined according to the mass of the implanted ion, and according to the material thickness to be crossed.

Advantageously, the passivation step E3 may be implemented by a hydrogen ion implantation. Indeed, the use of a hydrogen implantation, i.e. an implantation of H+ ions, allows passivating more efficiently a P-doped material than an N-doped material, using small ion implantation doses. In this manner, it is possible to selectively or differentially passivate a P-doped material rather than a N-doped material in one single step of the method.

Finally, the manufacturing method may comprise an annealing step E4 in which the optoelectronic device 1 is heated up to an annealing temperature, said annealing temperature being lower than 500° C. Advantageously, the annealing step E4 allows regenerating the N-doped semiconductor element, like for example the semiconductor core 11, in order to limit the impact of the passivation step E3 on this semiconductor element. This also allows obtaining a differential passivation between the N-doped semiconductor element, and the P-doped semiconductor element.

The previously-described arrangements allow manufacturing an optoelectronic device 1 comprising at least one light-emitting diode 10 comprising an implanted portion 30 having a locally reduced conductivity. The three-dimensional shape of the light-emitting diode 10 allows delimiting an implanted portion 30 in which the conductivity is reduced, during the passivation step E3.

The invention claimed is:

1. A method for manufacturing an optoelectronic device comprising the following steps:

a step of providing an initial optoelectronic device comprising:

a support extending according to a plane and having a support face; and at least one light-emitting diode cooperating directly or indirectly with said support face, said at least one light-emitting diode having a three-dimensional shape, and comprising a height extending according to a first direction between a proximal portion and a distal portion opposite to said proximal portion along said first direction, said light-emitting diode comprising a semiconductor core doped according to a first conductivity type, the proximal portion corresponding to a growth base of said semiconductor core, and comprising a semiconductor shell doped according to a second conductivity type opposite to the first conductivity type, said semiconductor shell covering at least partially said semiconductor core;

a step of passivating the at least one light-emitting diode to form the optoelectronic device, in which the at least one light-emitting diode is passivated over an implanted portion extending over an implanted height counted along the first direction, the implanted portion being parallel to the plane of the support, said implanted height being strictly smaller than the height of the light-emitting diode, said implanted portion being disposed between the distal portion and the proximal portion, and being separate from the distal portion, so that the implanted portion delimits within the semiconductor shell at least one passivated portion separate from the distal portion of the light-emitting diode, the semiconductor shell comprising at least one active portion delimited at least partially by said at least one passivated portion, said at least one passivated portion having a conductivity strictly lower than a conductivity of said at least one active portion wherein the at least one light-emitting diode is passivated so that the implanted portion also delimits within the semiconductor core at least one first implanted portion separate from the distal portion of the light-emitting diode, the semiconductor core comprising at least one first non-implanted portion delimited at least partially by said at least one first implanted portion, said at least one first implanted portion having an ion concentration strictly different from an ion concentration of said at least one first non-implanted portion.

2. The manufacturing method according to claim 1, wherein the passivation step is implemented by an ion implantation, in a manner allowing neutralising doping according to the second conductivity type of the semiconductor shell at the level of the passivated portion.

3. The manufacturing method according to claim 2, wherein the passivation step is implemented by a hydrogen ion implantation.

4. The manufacturing method according to claim 2, wherein the ion implantation is implemented starting from a rear face of the support, said rear face of the support being opposite to the support face of the support.

5. The manufacturing method according to claim 2, wherein the ion implantation is implemented starting from the support face.

6. The manufacturing method according to claim 1, wherein the passivation step is implemented at the level of the proximal portion, so that the proximal portion is included in the implanted portion.

7. The manufacturing method according to claim 1, wherein the passivation step is implemented so that the implanted portion is separate from the proximal portion.

8. The manufacturing method according to claim 1, further comprising a planarisation step in which a planarisation layer is deposited at the level of the support face of the support until a thickness of the planarisation layer, viewed according to the first direction and counted starting from the support face, is at least equal to the height of the at least one light-emitting diode.

9. The manufacturing method according to claim 8, wherein the planarisation step is implemented before the passivation step.

10. The manufacturing method according to claim 1, further comprising an annealing step in which the optoelectronic device is heated up to an annealing temperature, said annealing temperature being lower than 500° C.

* * * * *